United States Patent [19]
Zoerner et al.

[11] Patent Number: 5,729,151
[45] Date of Patent: Mar. 17, 1998

[54] SYSTEM AND METHOD FOR TESTING A PHASE LOCKED LOOP IN AN INTEGRATED CIRCUIT

[75] Inventors: Glen J. Zoerner; Danny H. Nguyen, both of Austin, Tex.

[73] Assignee: Motorola Inc., Schaumburg, Ill.

[21] Appl. No.: 610,783

[22] Filed: Mar. 11, 1996

[51] Int. Cl.[6] .................................................. G01R 31/28
[52] U.S. Cl. ................................... 324/765; 324/763
[58] Field of Search ............................ 324/602, 76.48, 324/765, 763, 158.1

[56] References Cited

U.S. PATENT DOCUMENTS 5,381,085  1/1995  Fischer ........................... 324/76.48
5,500,627  3/1996  Hulsing, II ............................ 331/1 A
5,596,280  1/1997  Riggio, Jr. ............................ 324/602

*Primary Examiner*—Ernest F. Karlsen

[57] ABSTRACT

A method for testing a phase locked loop (103) within an integrated circuit (100) is performed by utilizing an on-chip timer module (109) as a frequency counter (121) for counting the number of clock pulses outputted from the phase locked loop circuit (103) over a selected time period. The test is performed by an external testing device (111) having access to the address/data bus (110) coupled to both the phase locked loop circuit (103) and the timer module (109).

11 Claims, 3 Drawing Sheets

SYSTEM AND METHOD FOR TESTING A PHASE LOCKED LOOP IN AN INTEGRATED CIRCUIT

TECHNICAL FIELD

The present invention relates in general to data processing systems, and in particular, to a system and method for testing a phase locked loop circuit residing within an integrated circuit.

BACKGROUND INFORMATION

Various tests are performed during the manufacturing of an integrated circuit ("chip") to determine whether or not the various circuits implemented within the chip conform to desired specifications.

One of the circuits to be tested on a chip is a phase locked loop ("PLL") circuit embedded in the chip. The PLL circuit is tested to determine whether or not it accurately produces and locks a desired operating frequency which is to be distributed throughout the chip circuitry. One prior art technique for testing the operation of the PLL circuit has been the testing of each individual component of the PLL circuit. For example, the voltage controlled oscillator ("VCO"), the low pass filter ("LPF"), the charge pump, the phase detector, and the divider are all tested.

One of the problems with this prior art technique is that in many chip designs, it is not possible to gain external access to the output nodes of each one of these particular elements.

Another disadvantage of such prior art testing techniques is that they often require the use of an externally provided frequency counter to measure the resulting frequency from the output of the PLL circuit. First, this requires that the externally provided frequency counter be properly calibrated. Second, an externally provided frequency counter poses a logistics problem for the production and testing personnel, since it is an extra piece of equipment that can easily be misplaced.

Thus, there is a need in the art for an easier and simpler method for testing a PLL circuit embedded in a semiconductor chip.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
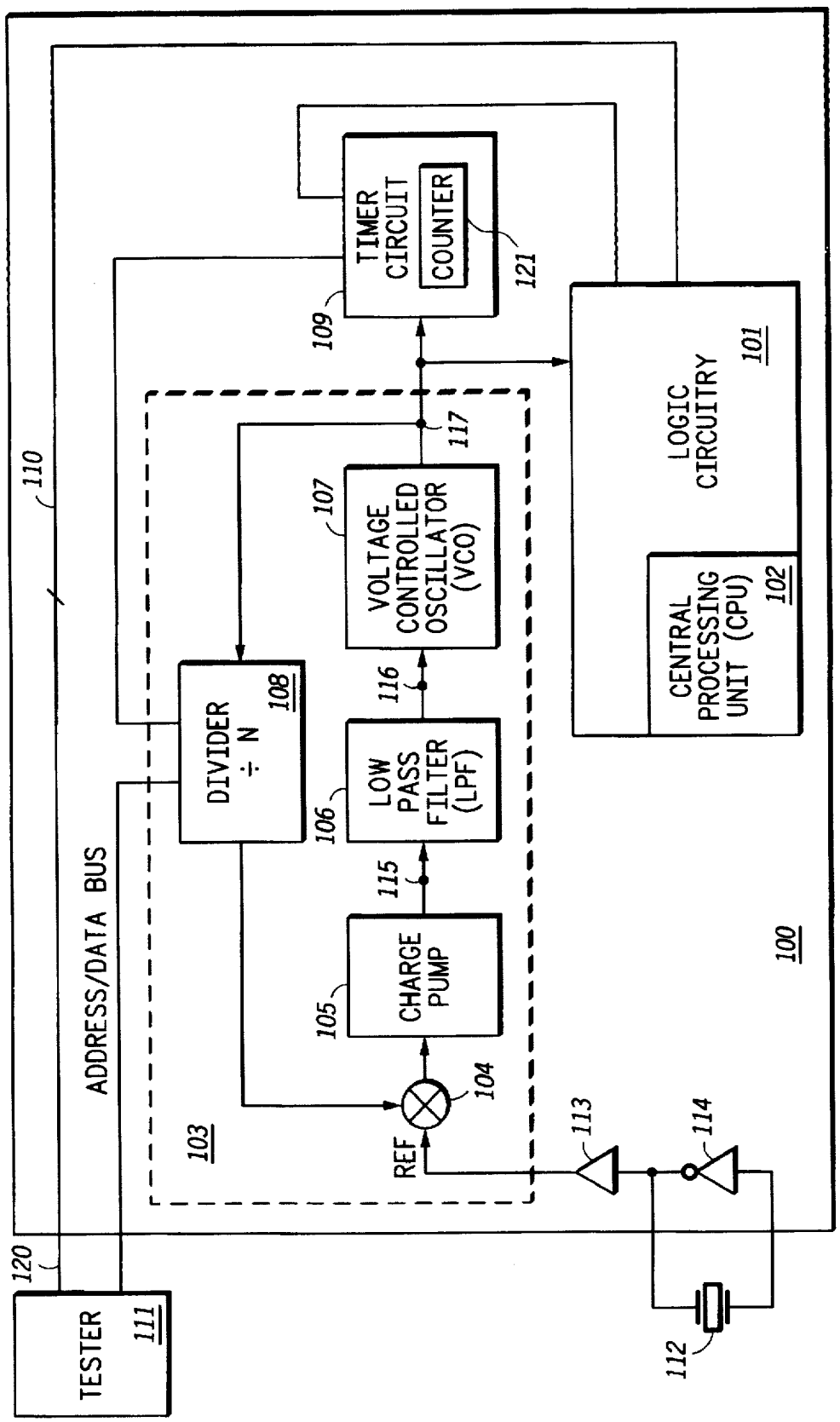
FIG. 1 illustrates, in block diagram form, a system for testing a PLL circuit in a chip in accordance with the present invention.

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Referring to FIG. 1, there is illustrated chip 100, which may be any well-known integrated circuit containing a microcontroller or a microprocessor.

Chip 100 includes logic circuitry 101 and core central processing unit ("CPU") 102. Clock signals are provided to logic circuitry 101 and CPU 102 by phase locked loop ("PLL") circuit 103. PLL circuit 103 may be any well-known phase locked loop circuit for providing multiple frequencies. PLL circuit 103 includes phase detector 104, charge pump 105, low pass filter ("LPF") 106, voltage controlled oscillator ("VCO") 107, and divider circuit 108. PLL circuit 103 receives a reference frequency clock signal, labeled as REF, from the oscillator circuit comprising device 113 and device 114 and crystal oscillator 112. Crystal oscillator 112 may be external to chip 100.

Also shown in FIG. 1 is timer circuit 109 typically found within a processor chip. Timer circuit 109 may include any well-known counter circuit 121. Timer circuit 109 (and counter circuit 121) is coupled to receive an output of PLL circuit 103.

Address/data bus 110 is coupled to divider circuit 108, timer circuit 109 (and counter circuit 121), logic circuitry 101 and CPU 102. External access to address/data bus 110 is provided by integrated circuit pin(s) 120. Shown coupled to pins 120 is tester device 111, which may comprise any well-known test device for testing clock signals, such as Model No. S1650 available from Schlumberger.

As noted above, a prior art technique for testing the accuracy of the output of PLL circuit 103 has included the coupling of an external test device to various nodes within PLL circuit 103, such as nodes 115, 116, and 117. In some chips, external access to such nodes is not provided. However, even if the signal outputted from any one of nodes 115–117 were brought to an external integrated circuit pin for test purposes, such nodes are typically extremely sensitive points, which can disturb the operation of PLL circuit 103 under normal operating conditions. For example, providing a path from node 116 to an external pin of chip 100 might result in that path acting as an antenna, which is capable of inputting noise signals into VCO 107.

The present invention provides the ability for a standard digital tester, such as test device 111, to check the tuning range and stability of PLL circuit 103. As described below, on-chip resources are reconfigured in test mode to perform the test under the supervision of test device 111.

The present invention utilizes on-chip timer circuit 109 as a frequency counter (counter circuit 121). Test device 111 provides the gate timebase, which controls the length of time that counter circuit 121 accumulates pulses, while control of PLL circuit 103 and counter circuit 121 is provided through their individual control registers (not shown) in test mode. By enabling counter circuit 121 to operate in a pulse accumulating mode to count pulses from VCO 107 with a known gate time controlled by test device 111, an accurate measure of the frequency outputted from PLL circuit 103 can be made.

Figure 3:
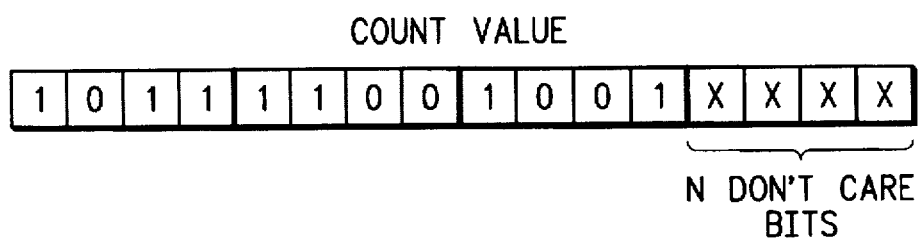
FIG. 3 illustrates "don't care" bits within the count value.

Referring next to FIG. 3, by carefully enabling test device 111 to control the gate time, a window comparison may be automatically made by "don't caring" one or more of the least significant bits counted by counter circuit 121. In other words, counter circuit 121 may be controlled by test device 111 to make a 16-bit count of pulses of the clock signal outputted from PLL circuit 103. When observing the count value, the N (N is a positive integer) least significant bits of the count value can be ignored. This number N is user-defined through test device 111 and will usually be dependent upon the desired accuracy of the output of PLL circuit 103. N is selected to provide a window of uncertainty which meets the desired phase locked loop specification. Using the example illustrated in FIG. 3, if the four least significant bits of the 16-bit count value are ignored, then a 0.5% "window" or margin of error is being allowed for in determining whether or not PLL circuit 103 conforms to desired specifications (e.g., chip 100 will pass the user-defined testing criteria if the output frequency from PLL circuit 103 is within 0.5% of the designed frequency value). In other words, if a ±0.5% frequency window is desired, then test device 111 will control counter circuit 121 to accumulate 1600 clock pulses. When the four least significant bits are "don't cared," a window of ±8 counts is opened, which is ±0.5%.

Figure 4:
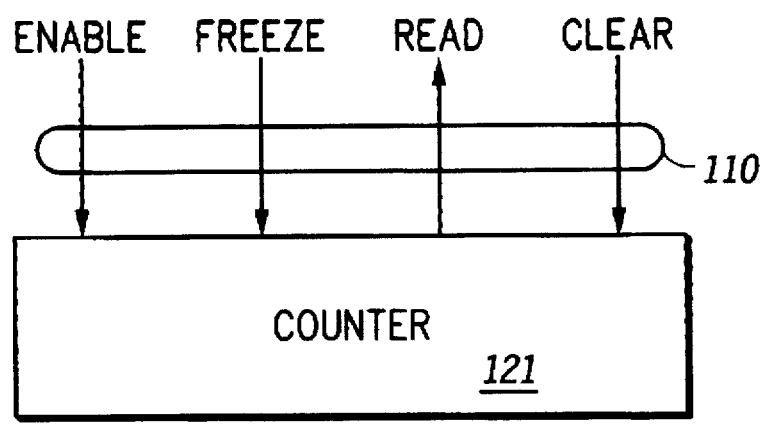
FIG. 4 illustrates signals supplied to and received from a counter of FIG. 1.
Figure 5:
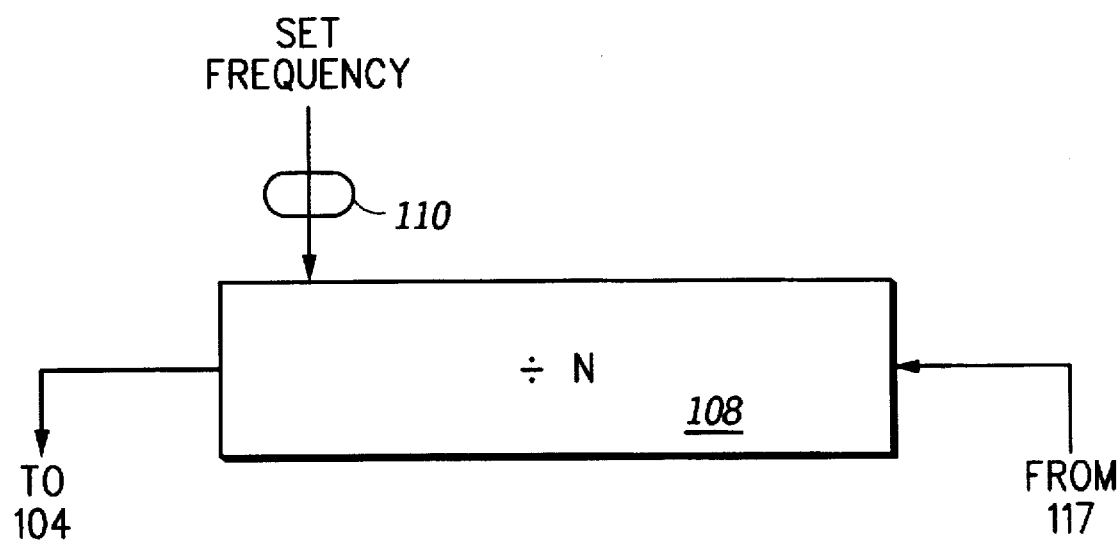
FIG. 5 illustrates signals supplied to and transmitted from a divider circuit of FIG. 1.

The foregoing test is implemented by test device 111 addressing and sending control signals on address/data bus 110 to divider circuit 108 and counter circuit 121. These control signals are shown in FIGS. 4 and 5 and discussed below with respect to FIG. 2. An ability to control such devices as divider circuit 108 and timer/counter circuit 109 is well-known in the art.

Figure 2:
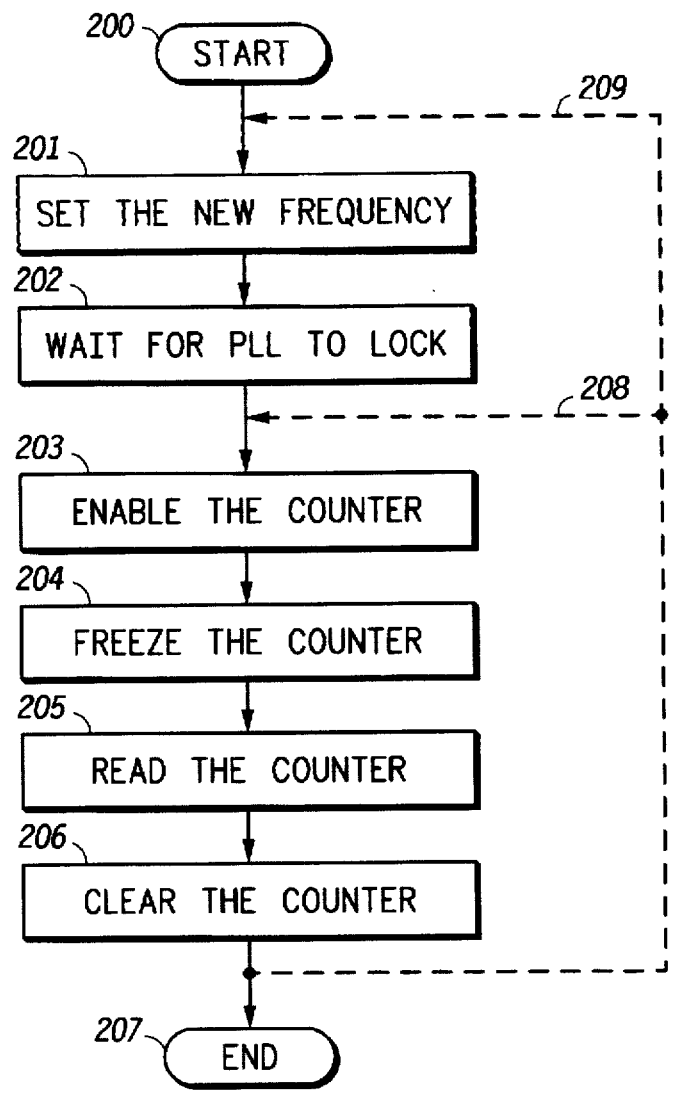
FIG. 2 illustrates a flow diagram of a method for testing a PLL circuit in a chip in accordance with the present invention.

Referring next to FIG. 2, there is illustrated a flow diagram of the testing method in accordance with the present invention. This method may be implemented as circuitry in test device 111. The process begins at step 200. Though not shown in FIG. 2, the start 200 of the testing method may include the disabling of logic circuitry 101 and CPU 102 when chip 100 is placed in a test mode by coupling test device 111 to pins 120.

Next, in step 201, PLL circuit 103 is programmed to a predetermined frequency by test device 111 addressing and sending control signals along bus 110 to divider circuit 108 (see FIG. 5). This ability to control the output frequency of PLL circuit 103 by sending control signals to divider circuit 108 is well-known in the art.

Next, in step 202, a programmable fixed time period is allowed to pass to wait until PLL circuit 103 locks at a new predetermined frequency. Thereafter, in step 203, counter circuit 121 is enabled in a pulse accumulating mode of operation via bus 110. Essentially, counter circuit 121 is enabled to perform the basic function of counting signal pulses received from VCO 107.

Next, in step 204, counter circuit 121 is stopped, or frozen, by another control signal from test device 111 after a fixed period of time determined by test device 111, also referred to herein as the gate time.

Next, in step 205, the value (number of pulses) counted by counter circuit 121 is read by test device 111 via address/data bus 110.

Then, in step 206, counter circuit 121 is cleared by another control signal from test device 111 and the test may then end at step 207. The signals sent to and read from counter circuit 121 are shown in FIG. 4.

However, the dashed path 208 from step 206 to step 203 may be taken by the testing method in order to perform multiple tests of the output of PLL circuit 103 by test device 111. Furthermore, the testing method may also proceed along dashed path 209 to perform similar tests for other predetermined frequencies to be output from PLL circuit 103.

Since the frequency being tested at the output of PLL circuit 103 is a known value, and since test device 111 enables counter circuit 121 for a predetermined amount of time, the acceptable count value outputted from counter circuit 121 is easily calculated. If this count value is not within the predefined margin of error, then PLL circuit 103 fails the test.

One of the advantages of the present invention is that it does not require external access to the output nodes of each one of the elements of PLL circuit 103, which would require coupling these nodes to external integrated circuit pins, which could affect the operating characteristics of a particular element.

Another advantage of the present invention is that it does not require the use of an externally provided frequency counter to measure the resulting frequency from the output of PLL circuit 103. First, this eliminates the requirement that the externally provided frequency counter be properly calibrated. Second, this eliminates the logistics problem for the production and testing personnel of keeping track of an externally provided frequency counter, since it is an extra piece of equipment that can be easily misplaced.

Although the present invention and its advantages have been described in detail, it should be understood that various changes, substitutions and alterations can be made herein without departing from the spirit and scope of the invention as defined by the appended claims.

What is claimed is:

1. A method for testing a phase locked loop ("PLL") circuit embedded in a chip, said method comprising the steps of:

setting said PLL to output a signal having a predetermined frequency;

enabling a counter circuit embedded in said chip and coupled to an output of said PLL circuit to count a number of pulses of said signal for a selected time period;

stopping said counter circuit at an end of said selected time period;

reading a count value produced by said counter circuit during said selected time period, wherein said count value is equal to a count of said number of pulses of said signal during said selected time period, wherein N least significant bits of said count value are ignored; and coupling an external test device to an address/data bus coupled to said PLL circuit and to said counter circuit, wherein said, external test device controls an operation of said setting, enabling, stopping, and reading steps.

2. The method as recited in claim 1, further comprising the step of:

waiting for a predetermined period of time to allow said PLL to lock said predetermined frequency, wherein said waiting step is performed between said setting step and said enabling step.

3. The method as recited in claim 1, further comprising the steps of:

clearing said counter circuit after said reading step; and repeating said enabling, stopping, and reading steps.

4. The method as recited in claim 1, further comprising the steps of:

clearing said counter circuit after said reading step; and repeating said setting, enabling, stopping, and reading steps for a different predetermined frequency.

5. The method as recited in claim 1, wherein said setting step comprises the step of:

sending a first control signal from said external test device via said address/data bus to a divider circuit in said PLL circuit, wherein said first control signal configures said PLL circuit to output said signal having said predetermined frequency.

6. The method as recited in claim 5, wherein said enabling step further comprises the step of:

sending a second control signal from said external test device via said address/data bus to said counter circuit to configure said counter circuit to begin counting said number of pulses of said signal, and wherein said stopping step further comprises the step of:

sending, after passage of said selected time period, a third control signal from said external test device via said address/data bus to said counter circuit to stop said counting of said number of pulses of said signal, and wherein said reading step is performed by said external test device via said address/data bus.

7. A system for testing a phase locked loop ("PLL") circuit embedded in a chip, said system comprising:

a timer circuit embedded in said chip and coupled to an output of said PLL circuit;

an address/data bus internal to said chip and coupled to said PLL circuit and said timer circuit;

an external test device; and connection means for coupling said external test device to said address/data bus, wherein said external test device is operable for:

sending a first control signal from said external test device via said address/data bus to said PLL circuit, wherein said first control signal configures said PLL circuit to output a clock signal having a predetermined frequency;

sending a second control signal from said external test device via said address/data bus to said timer circuit to configure said timer circuit to begin counting a number of pulses of said clock signal received by said timer circuit from said PLL circuit;

sending, after passage of a selected time period, a third control signal from said external test device via said address/data bus to said timer circuit to stop said counting of said number of pulses of said clock signal; and reading a count value produced by said timer circuit during said selected time period, wherein said count value is read by said external test device via said address/data bus, wherein said count value is equal to a count of said number of pulses of said clock signal during said selected time period, and wherein N least significant bits of said count value are ignored during said reading.

8. The system as recited in claim 7, wherein said external test device is operable for:

sending a fourth control signal from said external test device via said address/data bus to said timer circuit to clear said count value from said timer circuit; and repeating said sending steps and said reading step.

9. The system as recited in claim 7, wherein said external test device is operable for:

sending a fourth control signal from said external test device via said address/data bus to said timer circuit to clear said count value from said timer circuit; and repeating said sending steps and said reading step for a different predetermined frequency.

10. The system as recited in claim 7, wherein said chip comprises a processor coupled to said address/data bus.

11. A method for testing, with an external test device, a phase locked loop ("PLL") circuit embedded in a chip, said method comprising the steps of:

coupling said external test device to an address/data bus coupled to said PLL circuit and to a counter circuit embedded in said chip, wherein said counter circuit is coupled to an output of said PLL circuit;

sending a first control signal from said external test device via said address/data bus to a divider circuit in said PLL circuit, wherein said first control signal configures said PLL circuit to output a clock signal having a predetermined frequency;

waiting for a predetermined period of time to allow said PLL to lock said predetermined frequency;

sending a second control signal from said external test device via said address/data bus to said counter circuit to configure said counter circuit to begin counting a number of pulses of said clock signal for a selected time period;

sending, after passage of said selected time period, a third control signal from said external test device via said address/data bus to said counter circuit to stop said counting of said number of pulses of said clock signal; and reading via said address/data bus a count value produced by said counter circuit during said selected time period, wherein said count value is equal to a count of said number of pulses of said clock signal during said selected time period wherein N least significant bits of said count value are ignored during said reading step.

* * * * *